United States Patent
Nguyen et al.

(10) Patent No.: US 9,837,170 B2
(45) Date of Patent: Dec. 5, 2017

(54) SYSTEMS AND METHODS FOR TESTING PERFORMANCE OF MEMORY MODULES

(71) Applicant: GLOBALFOUNDRIES Singapore Pte. Ltd., Singapore (SG)

(72) Inventors: Bai Yen Nguyen, Singapore (SG); Benjamin Lau, Singapore (SG); Chou-Te Kang, Singapore (SG); Yao Hsien Huang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 21 days.

(21) Appl. No.: 14/312,837

(22) Filed: Jun. 24, 2014

(65) Prior Publication Data

US 2015/0371719 A1 Dec. 24, 2015

(51) Int. Cl.
| | | |
|---|---|---|
| *G11C 29/38* | (2006.01) | |
| *G11C 29/36* | (2006.01) | |
| *G11C 29/44* | (2006.01) | |
| *G11C 29/54* | (2006.01) | |

(52) U.S. Cl.
CPC .............. *G11C 29/38* (2013.01); *G11C 29/36* (2013.01); *G11C 29/44* (2013.01); *G11C 2029/3602* (2013.01)

(58) Field of Classification Search
CPC ......... G11C 29/38; G11C 29/36; G11C 29/44; G11C 2029/3602; G11C 29/56; G11C 29/48; G11C 29/40
See application file for complete search history.

(56) References Cited

U.S. PATENT DOCUMENTS

| | | | | |
|---|---|---|---|---|
| 6,522,167 B1* | 2/2003 | Ansari | ................ | G06F 15/7867 326/39 |
| 7,493,543 B1* | 2/2009 | Wu | ..................... | G01R 31/3016 714/725 |
| 2005/0043912 A1* | 2/2005 | Kang | ..................... | G11C 29/56 702/117 |
| 2005/0060600 A1* | 3/2005 | Jeddeloh | ............. | G06F 11/2221 714/5.11 |
| 2005/0259480 A1* | 11/2005 | Bains | ..................... | G11C 29/48 365/189.05 |
| 2011/0196641 A1* | 8/2011 | Sawai | ..................... | G06F 11/24 702/117 |
| 2013/0228672 A1* | 9/2013 | Jung | ......................... | G11C 7/06 250/208.1 |

* cited by examiner

*Primary Examiner* — April Y Blair
*Assistant Examiner* — Dipakkumar Gandhi
(74) *Attorney, Agent, or Firm* — Lorenz & Kopf, LLP

(57) ABSTRACT

A system and method for testing performance of a plurality of memory modules includes generating a clock signal at a set frequency and sending the clock signal to the memory modules. An initial data pattern is sent to an input of a first memory module. A subsequent data pattern received from the first memory module is delayed by a predetermined delay time and sent to an input of a last memory module. The initial data pattern and the subsequent data pattern received from the output of the last memory module are compared and a performance of the memory modules is also calculated.

16 Claims, 4 Drawing Sheets

SYSTEMS AND METHODS FOR TESTING PERFORMANCE OF MEMORY MODULES

TECHNICAL FIELD

The technical field relates to systems and method for testing performance of semiconductor memory.

BACKGROUND

Testing high performance silicon memory in a system-on-a-chip ("SoC") integrated circuit at-speed in the gigahertz ("GHz") range has shown to be problematic. Currently available test techniques have timing limitations produced by the built-in self-test ("BIST") controller circuit.

As such, it is desirable to present a system and method for testing memory at-speed in the GHz range. In addition, other desirable features and characteristics will become apparent from the subsequent summary and detailed description, and the appended claims, taken in conjunction with the accompanying drawings and this background.

BRIEF SUMMARY

In one embodiment, a method for testing performance of a plurality of memory modules is provided. The plurality of memory modules includes a first memory module and a last memory module. The method includes generating a clock signal at a set frequency and sending the clock signal to the memory modules. The method also includes generating an initial data pattern and sending the initial data pattern to an input of the first memory module. The method further includes delaying a subsequent data pattern received from an output of the first memory module by a predetermined delay time and sending the subsequent data pattern to an input of the last memory module. The method also includes receiving the subsequent data pattern from an output of the last memory module. The method further includes comparing the initial data pattern to the subsequent data pattern received from the output of the last memory module. A performance of the memory modules is also calculated.

In one embodiment, a system for testing performance of memory modules, including a first memory module and a last memory module, is provided. The system includes a clock generating circuit for generating a clock signal at a set frequency. The system also includes a controller in communication with the clock generating circuit and the memory modules. The controller is configured to generate an initial data pattern and send the initial data pattern to the first memory module. The system further includes a delay buffer disposed between the first memory module and the last memory module. The delay buffer is configured to receive a subsequent data pattern from an output of the first memory module and to delay the subsequent data pattern by a predetermined delay time. The controller is further configured to receive the subsequent data pattern output from an output of the last memory module, compare the initial data pattern to the subsequent data pattern received from the output of the last memory module, and calculate a performance of the memory modules.

BRIEF DESCRIPTION OF THE DRAWINGS

Other advantages of the disclosed subject matter will be readily appreciated, as the same becomes better understood by reference to the following detailed description when considered in connection with the accompanying drawings wherein.

DETAILED DESCRIPTION

Referring to the Figures, wherein like numerals indicate like parts throughout the several views, a system 100 and method 200 for testing performance of a plurality of memory modules is shown herein.

Figure 1:
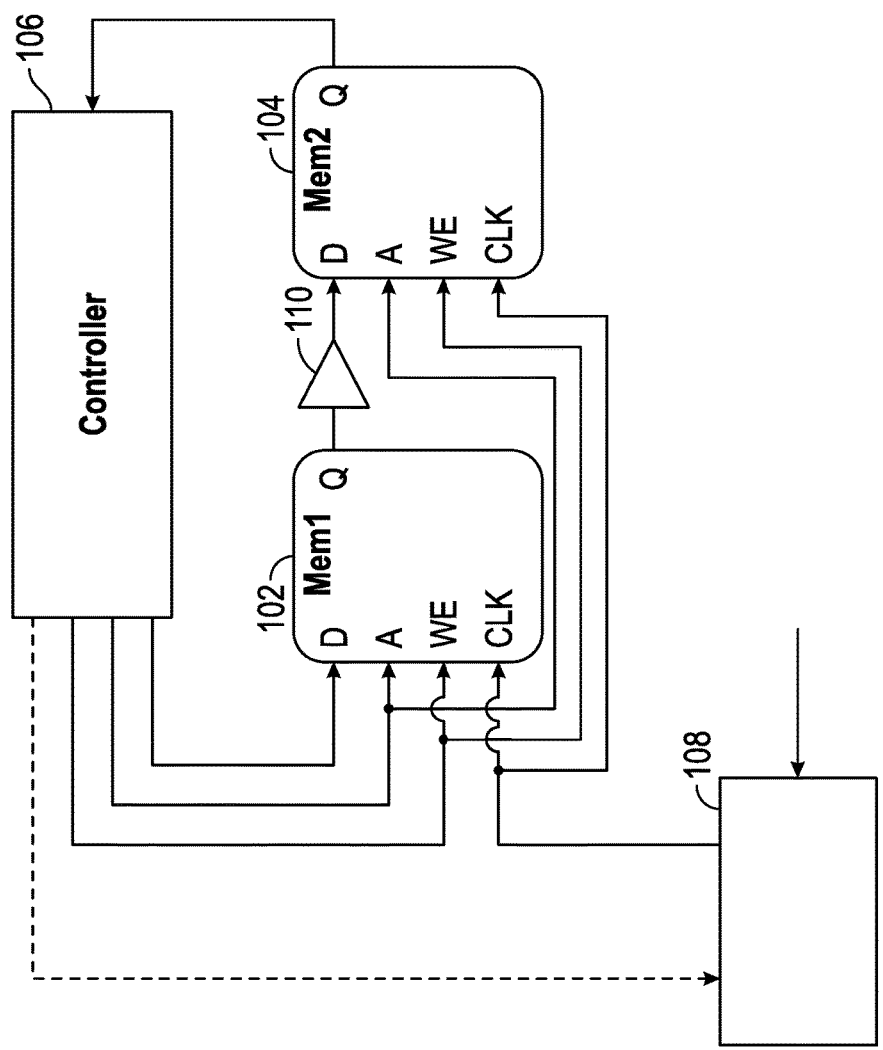
FIG. 1 is an electrical schematic diagram of a system for testing performance of memory modules according to one embodiment.
Figure 2:
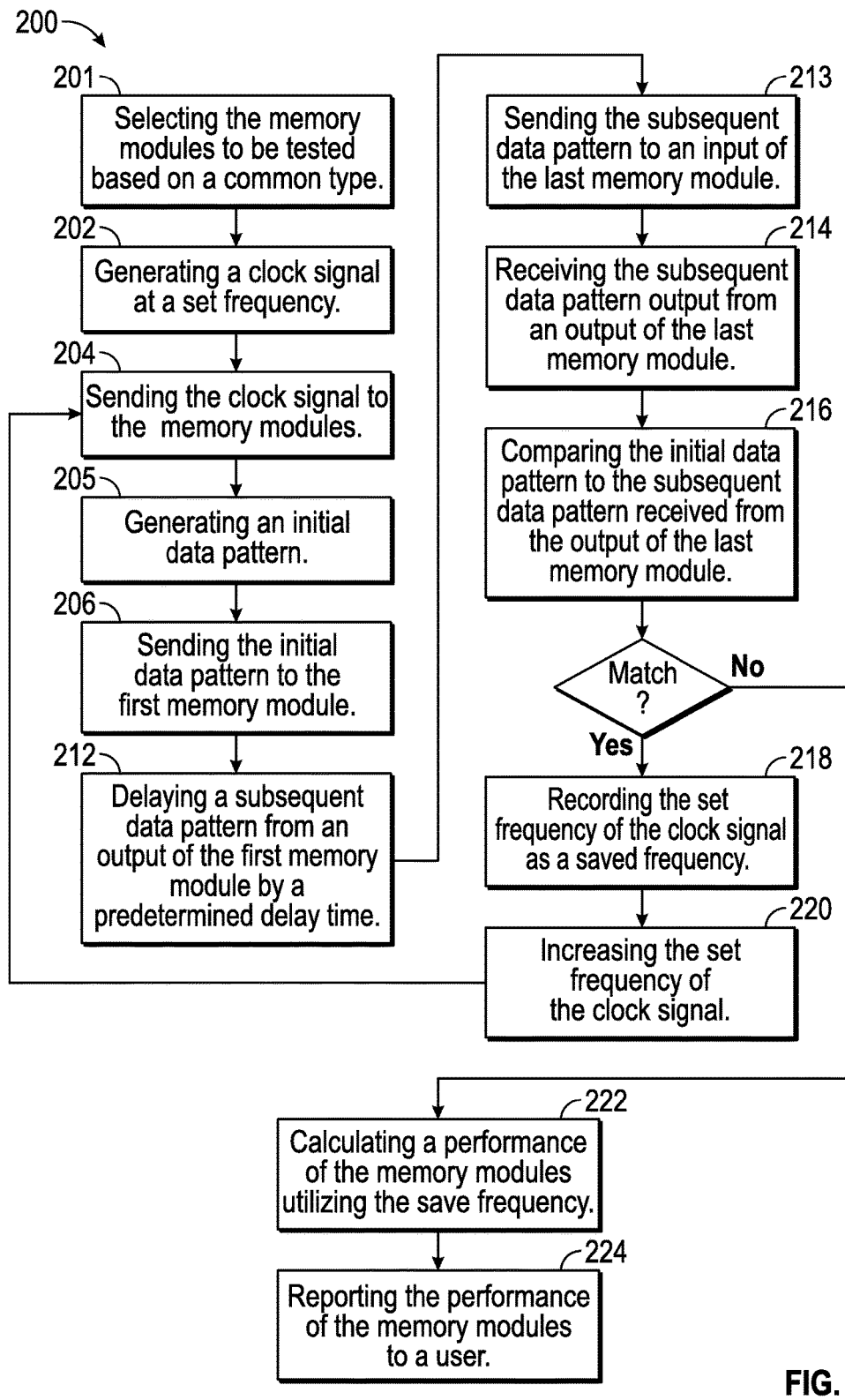
FIG. 2 is a flowchart showing a method for testing performance of memory modules according to one embodiment.

In the embodiment shown in FIG. 1, a first memory module 102 and a last memory module 104 are shown being tested by the system 100. The memory modules 102, 104 to be tested are of a common type. That is, the memory modules 102, 104 have the same density and configuration. For instance, the first and last memory modules 102, 104 in the FIG. 1 embodiment may be static random access memory ("SRAM") modules having a density of 1,024 ("1K") words, with each word being 32-bits in size, with a rated frequency of 500 MHz. Of course, numerous other types of memory modules may be tested by the system 100. Referring to FIG. 2, the method 200 of one exemplary embodiment includes, at 201, selecting at least two of the memory modules 102, 104 to be tested based on being of a common type.

Referring again to FIG. 1, each of the memory modules 102, 104 in this exemplary embodiment include a plurality of inputs and at least one output. The inputs include a data input D, an address input A, a write enable input WE, and a clock input CLK. The at least one output includes a data output Q. The inputs and/or outputs may include multiple ports. For example, the data input D may include 32 pins such that a 32-bit data "word" is delivered in parallel, as is readily appreciated by those skilled in the art. Of course, the memory modules 102, 104 may include additional inputs and/or outputs than those identified herein.

The system 100 includes a controller 106 for controlling operation of the system 100. The controller 106 includes a processor (not shown) capable of performing calculations and/or executing instructions (i.e., running a program). The processor may be implemented as a computer, a microprocessor, a microcontroller, an application specific integrated circuit ("ASIC") or any other suitable computational device as is widely known to those skilled in the art. The controller 106 includes a plurality of inputs (not numbered) for receiving data, signals, information, and/or other instructions. The controller 106 also includes a plurality of outputs (not numbered) for sending data, signals, information, and/or other instructions.

The controller 106 shown in the various figures is shown as a single unit. However, it should be understood that the controller 106 may be implemented as a plurality of separate components in communication with one another as is appreciated by those skilled in the art.

The controller 106 is in communication with the memory modules 102, 104 to control operation of the memory modules 102, 104. As an example, as shown in FIG. 1, the controller 106 is electrically connected to the data input D, the address input A, and the write enable input WE. Accordingly, the controller 106 may send data to the data input D, address information to the address input A, and a write enable signal to the write enable input WE, as is appreciated by those skilled in the art. The controller 106 of this exemplary embodiment is also electrically connected to the data output Q of the last memory module 104. As such, the controller 106 is able to receive data from the last memory module 104.

The system 100 also includes a clock generating circuit 108. The clock generating circuit 108 is configured to generate a clock signal that is utilized by the memory modules 102, 104. The clock signal generated by the clock generating circuit 108 is settable at a plurality of different frequencies. In one exemplary embodiment, the clock generating circuit 108 is implemented with a phased-lock loop ("PLL") circuit (not separately labeled). Specifically, the PLL circuit receives an oscillating signal, e.g., from an electronic oscillator, and generates the clock signal. In one embodiment, the PLL circuit has a jitter specification less than 3% of the generated frequency.

The controller 106 is in communication with the clock generating circuit 108. Moreover, the controller 106 is configured to control the frequency of the clock signal generated by the clock generating circuit 108. For instance, the controller 106 may transmit a digital code to the clock generating circuit 108 corresponding to the desired frequency of the clock signal. In FIG. 1, the clock generating circuit 108 is shown as a separate component from the controller 106. However, it should be appreciated that the controller 106 and the clock generating circuit 108 may be integrated together as a single unit.

Referring now to FIG. 2, the method 200 includes, at 202, generating a clock signal at a set frequency. The method 200 also includes, at 204, sending the clock signal to the memory modules 102, 104. With the exemplary system 100 shown in FIG. 1, generating the clock signal is performed by the clock generating circuit 108. For sending the clock signal to the memory modules 102, 104, an output (not labeled) of the clock generating circuit 108 is in communication with the clock inputs CLK of the first and last memory modules 102, 104.

The controller 106 is configured to generate an initial data pattern. The initial data pattern is a series of data that may be utilized for test purposes. The data pattern may be random or may be predetermined. The controller 106 may include a memory (not shown) for storing a predetermined data pattern. Of course, the controller 106 may be configured to generate a plurality of initial data patterns. However, for ease of readability, the term "initial data pattern" will typically be used herein.

Referring again to FIG. 2, the method 200 includes, at 206, sending the initial data pattern to the first memory module 102. With the exemplary system 100 shown in FIG. 1, an output (not labeled) of the controller 106 is in communication with the data input D of the first memory module 102 for facilitating the sending of the initial data pattern from the controller 106 to the first memory module 102.

The system 100 may also include one or more delay buffers 110. In the exemplary embodiment shown in FIG. 1, a delay buffer 110 is disposed between the first memory module 102 and the last memory module 104. Specifically, the delay buffer 110 is disposed between the output Q of the first memory module 102 and the input D of the last memory module 104. More specifically, in the embodiment shown in FIG. 1, the delay buffer 110 is configured to receive a data pattern from the output Q of the first memory module 102, delay the data pattern received from the output Q of the first memory module 102 by a predetermined delay time, and then send the data pattern to the input D of the last memory module 104.

Accordingly, as shown in FIG. 2, the method 200 further includes, at 212, delaying a subsequent data pattern from an output of the first memory module by a predetermined delay time. Once delayed, the subsequent data pattern is sent to subsequent memory modules, as shown at 213 in FIG. 2. In the exemplary embodiment shown in FIG. 1, the subsequent data pattern output from the delay buffer 110 is sent to the last memory module 104.

The method 200 also includes, at 214, receiving the subsequent data pattern at output from an output of the last memory module 104. Specifically, in the embodiment shown in FIG. 1, the subsequent data pattern is received by the controller 106.

Figure 3:
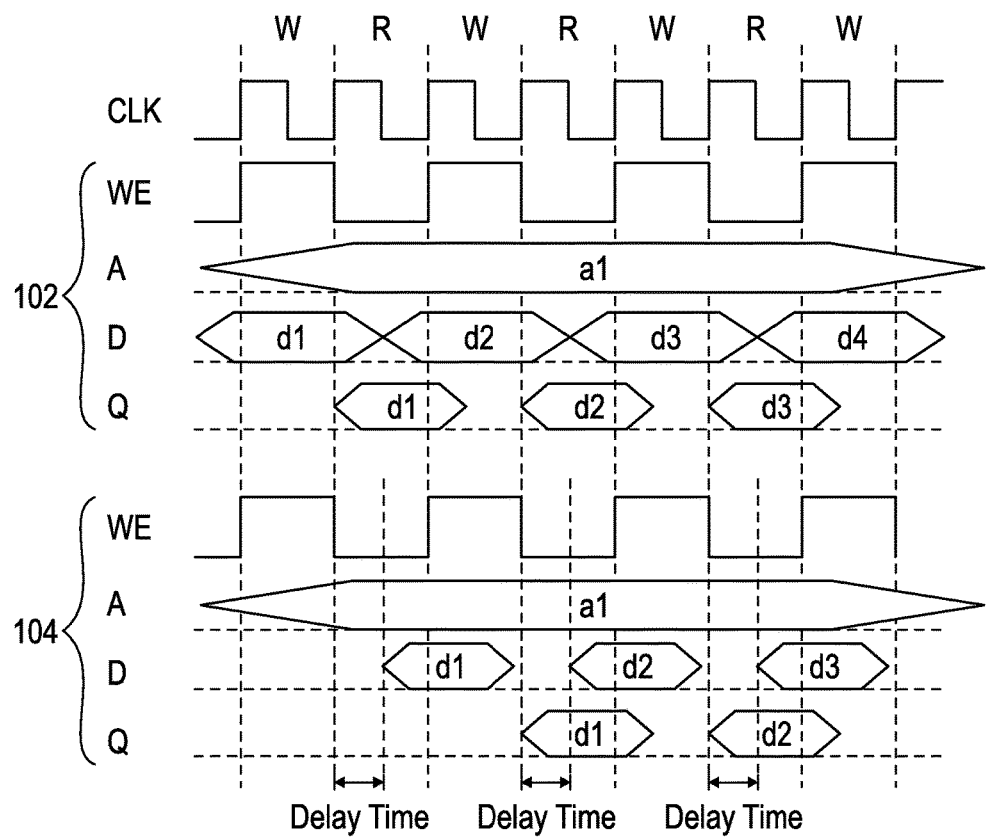
FIG. 3 is a timing diagram showing a flow of data patterns through a first memory module and a second memory module.

Operation of the system 100 and method 200 may be further understood with reference to FIG. 3, which presents a timing diagram for the first and last memory modules 102, 104 of embodiment shown in FIG. 1. The data patterns are labeled as d1, s2, d3, etc. The initial data patterns are shown at the input D of the first memory module 102. As can be seen, the data patterns d1, d2, d3 are read into the memory modules 102, 104 when the write enable WE inputs are enabled and output from the memory modules 102, 104 when the write enable WE inputs are disabled. The time delay provided by the delay buffer 110 allows the data patterns d1, d2, d3 output from the first memory module 102 when the write enable WE input of the first memory module 102 is disabled be input into the last memory module 104 when the write enable WE input of the last memory module 104 is enabled.

Referring again to FIG. 2, the method 200 further includes, at 216, comparing the initial data pattern to the subsequent data pattern received from the output of the last memory module 104. This comparison may be performed by the controller 106, as is the case in the exemplary embodiments.

If the initial data pattern matches the received subsequent data pattern, the method 200 continues, at 218, with recording the set frequency of the clock signal as a saved frequency. Said another way, recording the set frequency of the clock signal as a saved frequency is performed in response to the initial data pattern matching the subsequent data pattern received from the output of the last memory module. This saved frequency is one in which the memory modules perform without significant error in data reception and delivery. Also, this saved frequency is considered, at least temporarily, the highest frequency at which the memory modules 102, 104 may perform adequately.

In addition to recording the set frequency as a saved frequency, the method 200 also includes, at 220, increasing the set frequency of the clock signal in response to the initial data pattern matching the subsequent data pattern received from the output of the last memory module. Said another way, if the initial data pattern and the subsequent data pattern is matched, the set frequency of the clock signal is increased. In the exemplary embodiments, the controller 106 controls the frequency of the clock generating circuit 108, such that the controller 106 actuates the increase in the frequency of the clock signal.

After saving the set frequency as the saved frequency and increasing the set frequency, at least a portion of the method 200 may be repeated at the newly increased set frequency. In the exemplary embodiment of the method 200 shown in FIG. 2, the newly increased set frequency of the clock signal is sent to the memory modules 102, 104. The initial data pattern is also sent to the memory modules 102, 104. However, in this iteration, the memory modules 102, 104 will process the data patterns at an increased speed in accordance with the increased clock signal.

The sending of the data patterns and increasing of the clock signal continues and repeats until the subsequent data pattern does not match the initial data pattern. In the event of the subsequent and initial data patterns not matching, the saved clock frequency from the previous iteration is utilized to calculate a performance of the memory modules.

Accordingly, the method 200 includes, at 222, calculating a performance of the memory modules 102, 104 utilizing the saved frequency in response to the initial data pattern differing from the subsequent data pattern received from the output of the last memory module 104. One technique for determining the performance of the memory modules 102, 104 includes calculating a clock cycle time T. The clock cycle time T is determined utilizing a delay buffer delay time D, a memory access time A, and a memory setup time S. More specifically, the clock cycle time T is calculated by summing the delay buffer delay time D, the memory access time A, and the memory setup time S as follows: $T=A+D+S$.

The delay buffer delay time D is the predetermined time that the delay buffer 110 delays passage of the data pattern. The memory access time A is the time required to access instructions and data in each memory module 102, 104. The memory setup time S is the minimum setup time between the clock and input signals, which is needed to initiate a memory access cycle in each memory module 102, 104.

A memory performance ratio R can be found by dividing the sum of the memory access time A and the memory setup time S by the clock cycle time T as follows: $R=(A+S)/T$. The memory maximum performance M is determined by utilizing the memory performance ratio R and the saved frequency. Specifically, a clock period P is determined by inverting the saved frequency as follows: $P=1/f_s$. The memory maximum performance M may then be calculated as follows: $M=1/(P*R)$.

The method 200 may also include, at 224, reporting the performance M of the memory modules 102, 104 to a user. The reporting may be achieved by displaying the performance M on a display (not shown) in communication with the controller 106, printing the performance M on paper (not shown), writing the performance M to a database (not shown) for later retrieval by the user, or another reporting technique.

Figure 4:
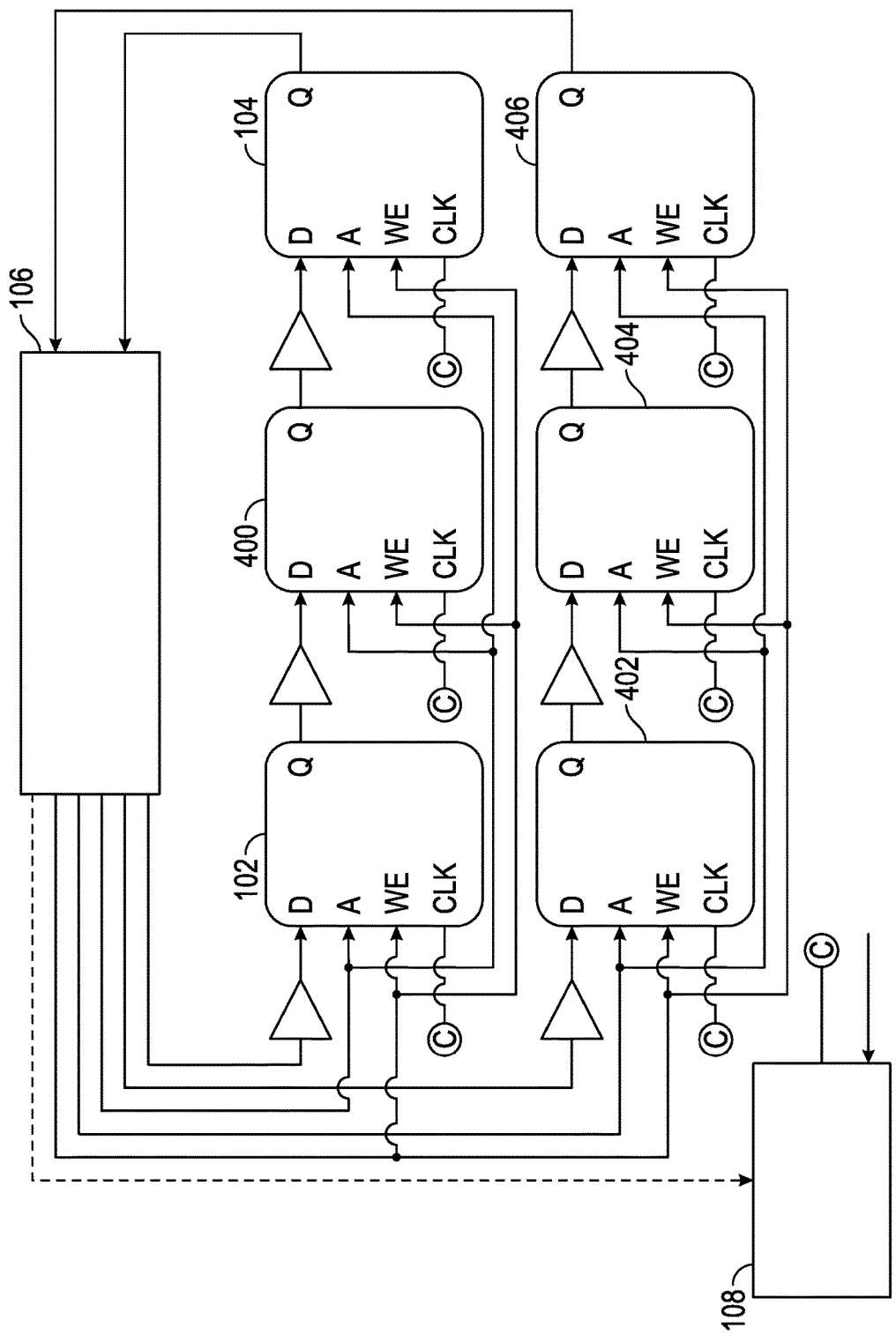
FIG. 4 is an electrical schematic diagram of the system according to another embodiment.

The system 100 and method 200 are not limited to testing only the two memory modules 102, 104 shown in FIG. 1. The system 100 and method may be utilized for testing any number of memory modules. For example, another embodiment of the system 100 is shown in FIG. 4. In this exemplary embodiment, an intermediary memory module 400 is electrically connected between the first and last memory modules 102, 104. This intermediary memory module 400 is of the same type as the first and last memory modules 102, 104. A delay buffer is electrically connected prior to each input D of each memory module 102, 400, 104. It should be appreciated that any number of additional memory modules 400 may be implemented in-between the first and the last memory modules 102, 104.

The system 100 and method 200 may also be implemented to test multiple types of memory modules at one time. As illustrated in FIG. 4, in addition to the first, intermediate, and last memory modules 102, 400, 104, three additional memory modules 402, 404, 406 are also shown. These additional memory modules 402, 404, 406 are of a different type from the first, intermediate, and last memory modules 102, 400, 104.

The system 100 and method 200 has numerous advantages over the prior art. For instance, the system 100 and method 200 are able to accurately characterize the performance of high speed SRAM at their specified operating speeds. Further, the system 100 and method 200 may be implemented to SRAM in any process node. Furthermore, the testing is performed at a low cost, including necessary hardware and software.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A method for testing performance of a plurality of memory modules including a first memory module and a last memory module, the plurality of memory modules being serially coupled with a common fixed delay therebetween and having a common memory density and memory configuration, said method comprising:
   (a) generating a clock signal having a frequency with a clock generating circuit;
   (b) sending the clock signal to the plurality of memory modules;
   (c) generating an initial data pattern with a controller;
   (d) sending the initial data pattern to an input of the first memory module;
   (e) delaying a subsequent data pattern received from an output of the first memory module by the common fixed delay time;
   (f) sending the subsequent data pattern to an input of the last memory module;
   (g) receiving the subsequent data pattern from an output of the last memory module;
   (h) comparing the initial data pattern to the subsequent data pattern received from the output of the last memory module with the controller; and
   (i) increasing the frequency of the clock signal and repeating steps (a)-(h) when the initial data pattern is identical to the subsequent data pattern and recording the frequency of the clock signal and calculating a performance of the memory modules with the controller when the initial data pattern is not identical to the subsequent data pattern.

2. The method as set forth in claim 1, further comprising reporting the performance of the memory modules to a user.

3. The method as set forth in claim 1, further comprising recording the frequency of the clock signal as a saved frequency in response to the initial data pattern matching the subsequent data pattern received from the output of the last memory module.

4. The method as set forth in claim 3, wherein calculating a performance of the memory modules further comprises calculating the performance of the memory modules utilizing the saved frequency in response to the initial data pattern differing from the subsequent data pattern received from the output of the last memory module.

5. The method as set forth in claim 4, wherein calculating the performance of the memory modules also utilizes the common fixed delay time.

6. The method as set forth in claim 5, wherein calculating the performance of the memory modules also utilizes a memory access time and a memory setup time.

7. A system for testing performance of a plurality memory modules including a first memory module and a last memory module, the first and last memory module being serially coupled with a common fixed delay therebetween and having a common memory density and memory configuration, said system comprising: a clock generating circuit for generating a clock signal at a frequency; a controller in communication with said clock generating circuit and the memory modules and configured to generate an initial data pattern and send the initial data pattern to the first memory module; and a common fixed delay buffer disposed between the plurality of memory modules including the first memory module and the last memory module configured to receive a subsequent data pattern from an output of the first memory module and delay the subsequent data pattern by the common fixed delay time; said controller further configured to receive the subsequent data pattern output from an output of the last memory module, compare the initial data pattern to the subsequent data pattern received from the output of the last memory module, and repeatedly increase the frequency of the clock signal and resend the initial data pattern to the first memory module when the subsequent data pattern is identical to the initial data pattern, and the controller configured to record the frequency of the clock signal and calculate a performance of the memory modules when the subsequent data pattern is not identical to the initial data pattern.

8. The system as set forth in claim 7, wherein said controller is further configured to report the performance of the memory modules to a user.

9. The system as set forth in claim 7, wherein said controller is further configured to record the frequency of the clock signal as a saved frequency in response to the initial data pattern matching the subsequent data pattern received from the output of the last memory module.

10. The system as set forth in claim 9, wherein said controller is further configured to calculate the performance of the memory modules utilizing the saved frequency in response to the initial data pattern differing from the subsequent data pattern received from the output of the last memory module.

11. The system as set forth in claim 9, wherein said controller is further configured to calculate the performance of the memory modules utilizing the saved frequency and the common fixed delay time of said delay buffer in response to the initial data pattern differing from the subsequent data pattern received from the output of the last memory module.

12. A method for testing performance of a plurality of serially-coupled memory modules each of the serially-coupled memory modules with a common fixed delay therebetween having a common memory density and memory configuration, said method comprising:
    (a) generating a clock signal at a frequency with a clock generating circuit;
    (b) sending the clock signal to the plurality of serially-coupled memory modules;
    (c) generating an initial data pattern with a controller;
    (d) sending the initial data pattern to an input of a first memory module of the plurality of serially-coupled memory modules under test;
    (e) delaying a subsequent data pattern received from an output of the first memory module by the common fixed delay time;
    (f) sending the subsequent data pattern to an input of a next memory module of the plurality of serially-coupled memory modules under test;
    (g) delaying a subsequent data pattern received from an output of the next memory module by the common fixed delay time;
    (h) sending the subsequent data pattern to an input of a last memory module of the plurality of serially-coupled memory modules under test;
    (i) comparing the initial data pattern to the subsequent data pattern received from an output of the last memory module of the plurality of serially-coupled memory modules under test with the controller; and
    (j) increasing the frequency of the clock signal and repeating steps (a) through (i) when the subsequent data pattern matches the initial data pattern and calculating a performance of the memory modules with the controller when the subsequent data pattern does not match the initial data pattern.

13. The method as set forth in claim 12, further comprising recording the frequency of the clock signal as a saved frequency in response to the initial data pattern matching the subsequent data pattern received from the output of the last memory module of the plurality of serially-coupled memory modules under test.

14. The method as set forth in claim 13, wherein calculating the performance of the plurality of serially-coupled memory modules under test further comprises calculating the performance of the plurality of serially-coupled memory modules under test utilizing the saved frequency.

15. The method as set forth in claim 14, wherein calculating the performance of the plurality of serially-coupled memory modules under test also utilizes the common fixed delay time between the plurality of serially-coupled memory modules.

16. The method as set forth in claim 15, wherein calculating the performance of the plurality of serially-coupled memory modules under test also utilizes a memory access time and a memory setup time.

* * * * *